(12) United States Patent
Elgaard et al.

(10) Patent No.: US 11,016,526 B2
(45) Date of Patent: *May 25, 2021

(54) INTEGRATED CIRCUIT WITH CLOCK DISTRIBUTION

(71) Applicant: Telefonaktiebolaget LM Ericsson (publ), Stockholm (SE)

(72) Inventors: Christian Elgaard, Lund (SE); Magnus Åström, Lund (SE); Fredrik Tillman, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

This patent is subject to a terminal disclaimer.

(21) Appl. No.: 16/984,533

(22) Filed: Aug. 4, 2020

(65) Prior Publication Data

US 2020/0363833 A1     Nov. 19, 2020

Related U.S. Application Data

(63) Continuation of application No. 16/636,695, filed as application No. PCT/EP2017/070425 on Aug. 11, 2017, now Pat. No. 10,775,835.

(51) Int. Cl.
| G06F 1/10 | (2006.01) |
| G06F 1/06 | (2006.01) |

(Continued)

(52) U.S. Cl.
CPC ............... *G06F 1/10* (2013.01); *G06F 1/06* (2013.01); *H03K 5/135* (2013.01); *H04B 1/0458* (2013.01)

(58) Field of Classification Search
CPC combination set(s) only.
See application file for complete search history.

(56) References Cited

U.S. PATENT DOCUMENTS

| 7,499,513 B1 | 3/2009 | Tetzlaff et al. |
| 7,542,005 B2 * | 6/2009 | Mohamadi ............... H01Q 1/38 |
| | | 343/795 |

(Continued)

*Primary Examiner* — Adam D Houston
(74) *Attorney, Agent, or Firm* — Murphy, Bilak & Homiller, PLLC

(57) ABSTRACT

An integrated circuit (10, 10*a-d*) is disclosed, which is configured to be connected to an antenna module (3) having multiple antenna elements (17). The integrated circuit (10, 10*a-d*) comprises a plurality of communications circuits ($50_j$), each of which is configured to be connected to an antenna element (17) of the antenna module (3). It also comprises a first clock input terminal ($55_1$) configured to receive a reference clock signal from outside the integrated circuit (10, 10*a-d*) and a first clock-distribution network ($60_1$) connected between the first clock input terminal ($55_1$) and a first subset ($65_1$) of the communication circuits ($50_j$). Furthermore, it comprises a second clock input terminal ($55_2$) configured to receive a reference clock signal from outside the integrated circuit (10, 10*a-d*) and a second clock-distribution network ($60_1$) connected between the second clock input terminal ($55_2$) and a second subset ($65_2$) of the communication circuits ($50_j$).

12 Claims, 3 Drawing Sheets

(51) Int. Cl.
*H03K 5/135* (2006.01)
*H04B 1/04* (2006.01)

(56) References Cited

U.S. PATENT DOCUMENTS

| | | | |
|---|---|---|---|
| 7,884,776 B2* | 2/2011 | Mohamadi | H01Q 21/062 |
| | | | 343/853 |
| 9,379,438 B1* | 6/2016 | Runyon | H01Q 1/523 |
| 9,531,356 B1 | 12/2016 | Delos et al. | |
| 10,461,753 B1* | 10/2019 | Pritchard | H03L 7/00 |
| 10,509,104 B1* | 12/2019 | Data | G01S 7/032 |
| 10,775,835 B2* | 9/2020 | Elgaard | G06F 1/06 |
| 2007/0018903 A1* | 1/2007 | Mohamadi | H03F 3/604 |
| | | | 343/853 |
| 2007/0091712 A1 | 4/2007 | Mohanavelu et al. | |
| 2007/0120588 A1 | 5/2007 | Lim et al. | |
| 2008/0079649 A1* | 4/2008 | Mohamadi | H01L 23/66 |
| | | | 343/853 |
| 2009/0273517 A1* | 11/2009 | Thiesen | H01Q 3/2605 |
| | | | 342/372 |
| 2012/0187988 A1* | 7/2012 | Aryanfar | H03K 7/093 |
| | | | 327/156 |
| 2012/0188138 A1* | 7/2012 | Liu | H01Q 13/02 |
| | | | 343/776 |
| 2015/0148098 A1* | 5/2015 | Grau Besoli | H01Q 1/007 |
| | | | 455/553.1 |
| 2016/0134323 A1* | 5/2016 | Bengtsson | H04B 7/0691 |
| | | | 455/562.1 |
| 2016/0248169 A1* | 8/2016 | Mohammadian | H01Q 21/065 |
| 2016/0308563 A1* | 10/2016 | Ouyang | H04B 1/03 |
| 2017/0062928 A1* | 3/2017 | Legare | H01Q 21/065 |
| 2017/0153332 A1* | 6/2017 | Wallace | H01Q 25/02 |
| 2017/0215144 A1* | 7/2017 | Sasson | H04L 27/2271 |
| 2018/0011180 A1* | 1/2018 | Warnick | G01S 13/06 |
| 2018/0109005 A1* | 4/2018 | Milano | H01Q 21/0075 |
| 2018/0138866 A1* | 5/2018 | Liang | H03K 3/356182 |
| 2018/0198204 A1* | 7/2018 | Kovacic | H01Q 3/28 |
| 2019/0020121 A1* | 1/2019 | Paulotto | H01Q 1/243 |
| 2019/0027802 A1* | 1/2019 | Noori | H01Q 3/30 |
| 2019/0089053 A1* | 3/2019 | Yong | H01Q 3/26 |
| 2019/0348761 A1* | 11/2019 | Miehle | H04B 1/0458 |
| 2019/0377075 A1* | 12/2019 | Tsfati | G01S 13/04 |
| 2020/0106188 A1* | 4/2020 | Ou | H01Q 15/0086 |
| 2020/0119742 A1* | 4/2020 | Jain | G06F 1/10 |
| 2020/0158848 A1* | 5/2020 | Shafi | G01S 7/023 |
| 2020/0186162 A1* | 6/2020 | Bal | H03M 3/50 |
| 2020/0194898 A1* | 6/2020 | Choon | H01Q 1/48 |
| 2020/0195197 A1* | 6/2020 | Leabman | A61B 5/024 |
| 2020/0241590 A1* | 7/2020 | Elgaard | H04B 1/0475 |

* cited by examiner driven by $90_1$
driven by $90_2$
driven by $90_3$
driven by $90_4$ driven by $90_1$
driven by $90_2$
driven by $90_3$
driven by $90_4$

INTEGRATED CIRCUIT WITH CLOCK DISTRIBUTION

TECHNICAL FIELD

The present disclosure relates to reference clock signal distribution in integrated circuits.

BACKGROUND

Antenna array systems will be a ubiquitous component in forthcoming 5G (fifth generation) communication systems as a means of improving capacity at the presently used low GHz frequencies but more so to ensure sufficient coverage as the operating frequency extends to the mmW range. Antenna arrays typically consists of a regular structure of equi-spaced antenna elements.

Antenna arrays can be used to simultaneously transmit or receive multiple layers, e.g. through multiple beams in the special case of line-of-sight (LOS) communication or more generally through the concept of MU-MIMO (multi-user MIMO (multiple-input multiple-output)). During beam forming the antenna correlation properties are important such that highly correlated antennas may be combined coherently and thereby increasing the transmission efficiency. Typically, adjacent antennas present a higher correlation than distant antenna elements.

One key parameter when designing the 5G concept is energy efficiency. A base station may be equipped with a high number of antenna elements, even in the order of hundreds, and include a plurality of transceiver integrated circuits (ICs). In some use scenarios, all antenna elements and transceiver ICs might not be needed. Hence there is an opportunity to implement energy saving schemes by disabling, or inactivating, parts of the base station, sometimes even inactivating one or more complete transceiver IC.

SUMMARY

The inventors have realized that a reduced impact of reference clock phase noise can, at least for some usages, be obtained for ICs comprising multiple communication circuits (e.g. transceiver, transmitter, or receiver circuits) by means of using multiple input terminals for reference clock signals. An example of such a usage is when a communication apparatus comprising multiple such integrated circuits operates in a mode when only a subset of the ICs are enabled.

According to a first aspect, there is provided an integrated circuit configured to be connected to an antenna module having multiple antenna elements. The integrated circuit comprises a plurality of communications circuits, each of which is configured to be connected to an antenna element of the antenna module. It also comprises a first clock input terminal configured to receive a reference clock signal from outside the integrated circuit and a first clock-distribution network connected between the first clock input terminal and a first subset of the communication circuits. Furthermore, it comprises a second clock input terminal configured to receive a reference clock signal from outside the integrated circuit and a second clock-distribution network connected between the second clock input terminal and a second subset of the communication circuits.

The integrated circuit may comprise additional clock input terminals configured to receive reference clock signals from outside the integrated circuit. Furthermore, for each of said additional clock input terminals, the integrated circuit may comprise a clock-distribution network connected between that clock input terminal and an associated subset of the communication circuits.

Said clock-distribution networks may comprise buffer amplifiers connected in a tree structure.

Each of the plurality of communication circuits may have a reference-clock input connected to an output of a buffer amplifier of a clock-distribution network.

The communication circuits may, for instance, be transceiver circuits, receiver circuits, or transmitter circuits.

The communication circuits may be configured to communicate at a common radio frequency carrier frequency.

According to a second aspect, there is provided a communication apparatus comprising a reference clock signal generator configured to generate a main reference clock signal and a clock buffer circuit configured to receive the main reference clock signal at an input terminal and having a plurality of output buffers, each configured to output a reference clock signal with the same frequency as the main reference clock signal at an output terminal of the output buffer. The communication apparatus also comprises a plurality of integrated circuits according to the first aspect. Each output buffer of the clock buffer circuit has its output terminal connected to at most one of the clock input terminals of the same one of the integrated circuits.

The communication apparatus may comprise an antenna module having multiple antenna elements, each connected to a communication circuit of an integrated circuit among said plurality of integrated circuit.

The reference clock signal generator may, for instance, be a crystal oscillator.

In some embodiments, the communication apparatus is configured to selectively disable one or more of the plurality of integrated circuits.

In some embodiments, the communication apparatus is configured to operate with beamforming transmission or reception.

The communication apparatus may be configured for operation in a cellular communications network. For example, the communication apparatus may be a base station.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
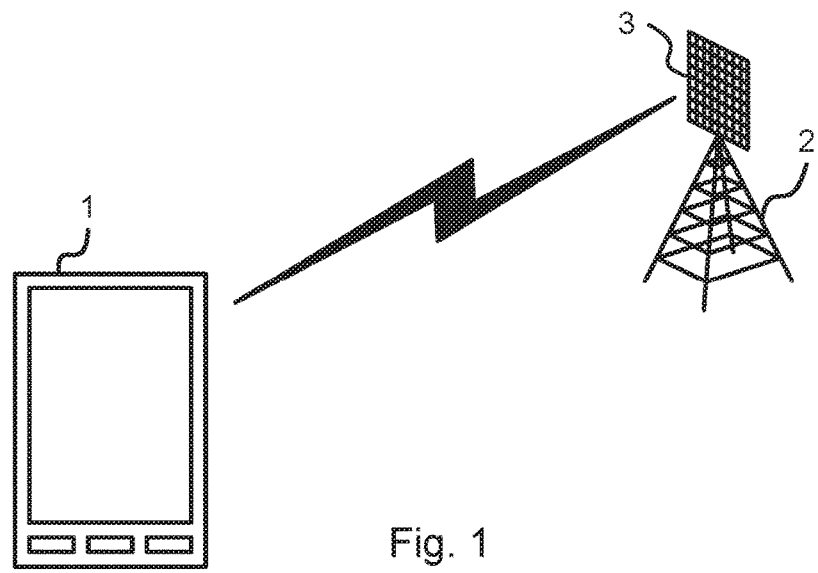
FIG. 1 illustrates a communication environment.

FIG. 1 illustrates a communication environment wherein embodiments of the present invention may be employed. A wireless device 1 of a cellular communications system is in wireless communication with a radio base station 2 (or "base station 2" for short) of the cellular communications system. The wireless device 1 may be what is generally referred to as a user equipment (UE). The wireless device 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2. However, other types of communication apparatuses can be considered as well, such as a WiFi access point or WiFi enabled device.

According to the example shown in FIG. 1, the radio base station 2 is equipped with an antenna module 3, such as an antenna array comprising a plurality of antenna elements.

Figure 2:
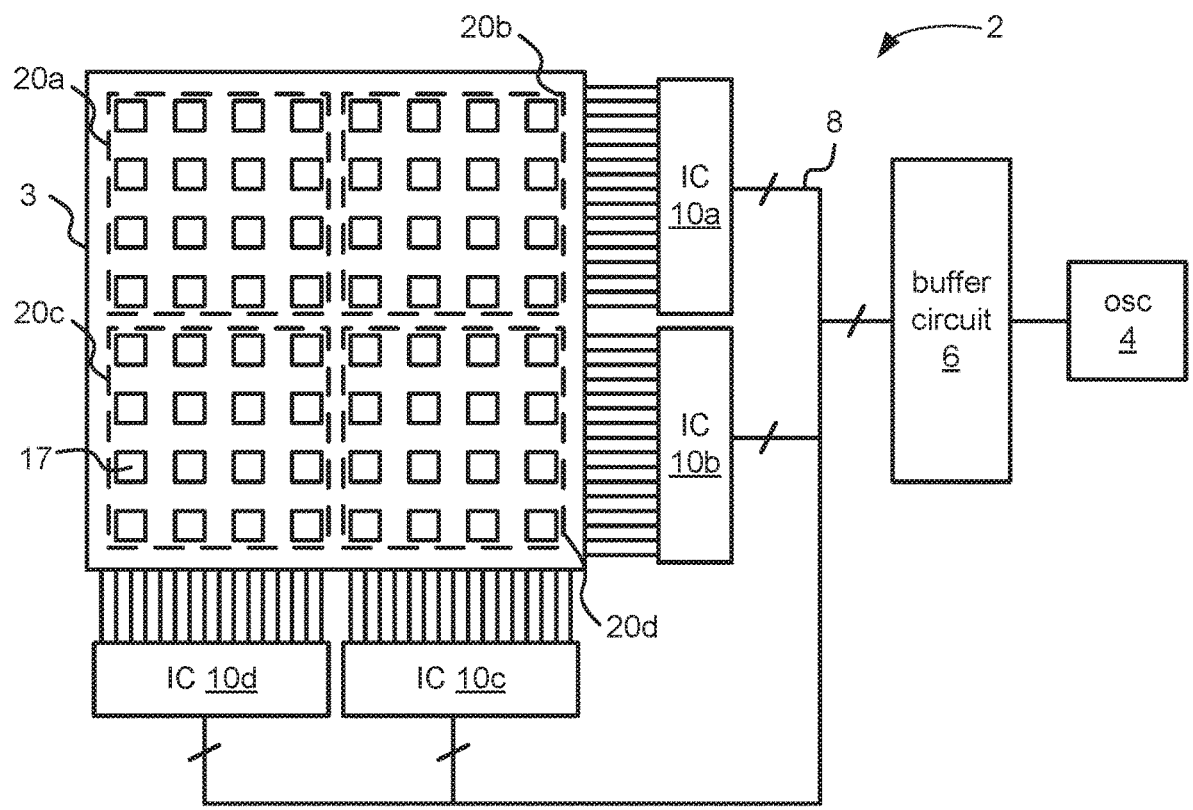
FIGS. 2-4 show block diagrams.

FIG. 2 is a block diagram of (part of) the base station 2 according to some embodiments. It comprises a reference clock signal generator 4 configured to generate a main reference clock signal. For instance, the reference clock signal generator 4 may be a crystal oscillator. In FIG. 2, the base station 2 further comprises a clock buffer circuit 6, which is configured to receive the main reference clock signal at an input terminal. The clock buffer circuit is further configured to output buffered reference clock signals on with the same frequency as the main reference clock signal. FIG. 2 shows a connection 8 with multiple wires from the clock buffer circuit 6. The individual wires are referred to with the reference sign $8_m$ where m is an integer index identifying the individual wire. Each individual wire is dedicated to carry one of the buffered reference clock signals. In the embodiment illustrated in FIG. 2, the base station 2 further comprises a plurality of integrated circuits (IC) 10a-d, which are further described below with reference to FIG. 3. As described below, each IC 10-d comprises a number of communication circuits (referred to with reference signs $50_j$, where j is an integer index identifying an individual communication circuit), such as transmitter circuits, receiver circuits, or transceiver circuits. Each such communication circuit $50_j$ is configured to be connected an antenna element 17 of the antenna module 3. Reference sign 17 is used herein as a general reference to the antenna elements. For simplicity and ease of illustration, only one of the squares representing antenna elements in FIG. 2 is provided with the reference number 17. The communication circuits $50_j$ may be configured to communicate at a common radio frequency carrier frequency. For example, in this way, the base station 2 may be configured to operate with beamforming or MIMO transmission or reception. The buffered reference clock signals may be used in the ICs 10a-d to generate local oscillator (LO) signals for up-conversion of a signal to be transmitted to the radio frequency carrier frequency and/or down-conversion of a received signal from the radio frequency carrier frequency. This can for example be accomplished using phase-locked loops (PLLs) or other frequency synthesizers.

As an elucidating example, which is used in this description to illustrate how embodiments disclosed herein may be advantageously employed, the antenna module 3 is, in FIG. 2, conceptually divided into sub arrays 20a-d. In the example, the antenna elements 17 in the sub array 20a are connected to communication circuits in the IC 10a, the antenna elements 17 in the sub array 20b are connected to communication circuits in the IC 10b, the antenna elements 17 in the sub array 20c are connected to communication circuits in the IC 10c, and the antenna elements 17 in the sub array 20d are connected to communication circuits in the IC 10d. The base station 2 may be configured to selectively disable one or more of the plurality of integrated circuits 10a-d, e.g. to save energy. Embodiments disclosed herein can provide a relatively low impact of phase noise in the reference clock signals in scenarios where only a subset of the sub arrays 20a-d and ICs 10a-d are enabled.

Figure 3:
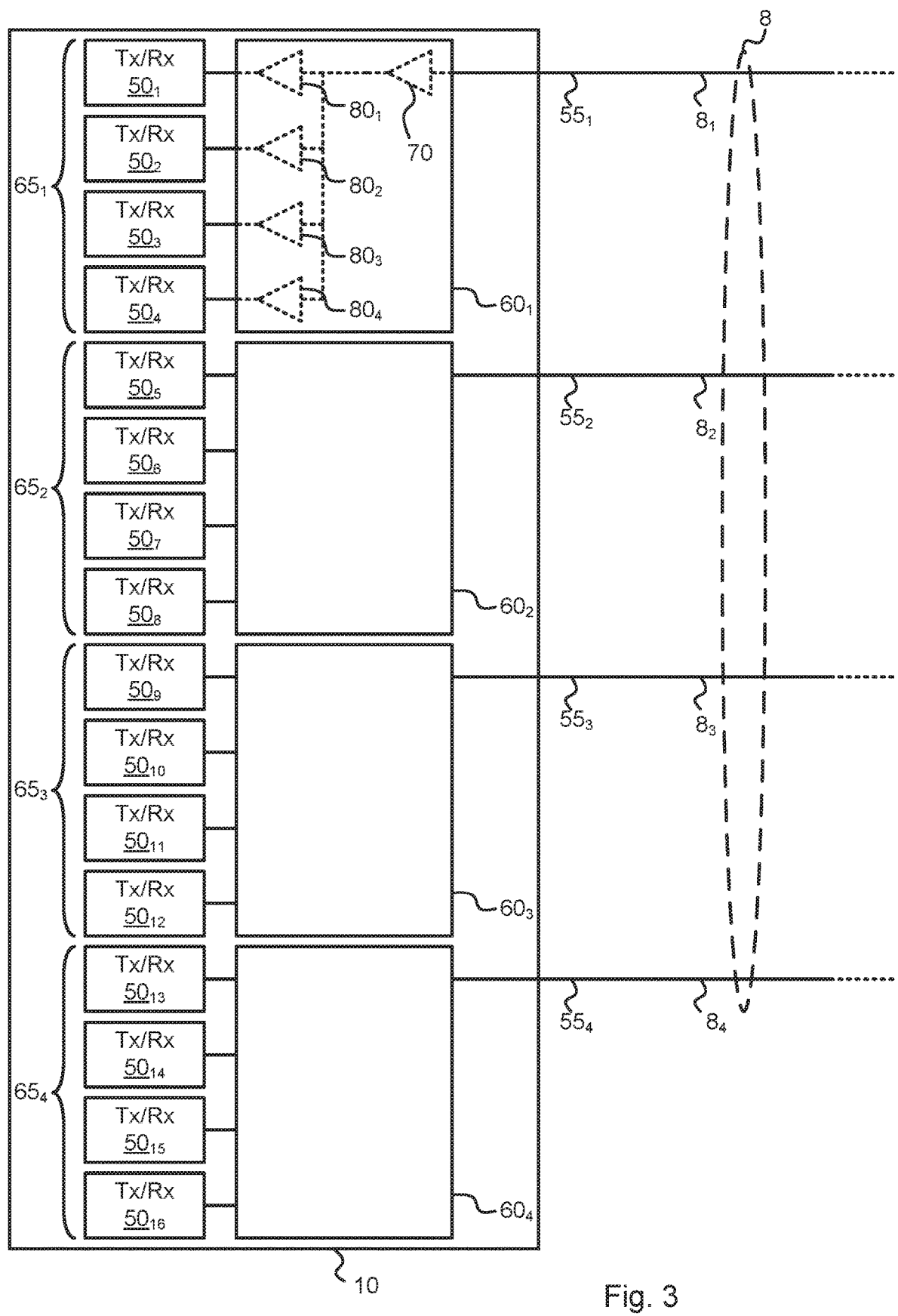

FIG. 3 is a block diagram of an IC 10 according to an embodiment. Each of the ICs 10a-d may be implemented in the same way as the IC 10. The IC 10 comprises a plurality of communications circuits $50_j$, each of which is configured to be connected to an antenna element 17 of the antenna module 3. Furthermore, the IC 10 comprises a rust clock input terminal $55_1$ configured to receive a reference clock signal from outside the integrated circuit 10. In FIG. 3, the first clock input terminal $55_1$ is connected to the wire $8_1$. The IC 10 also comprises a first clock-distribution network $60_1$ connected between the first clock input terminal $55_1$ and a first subset $65_1$ of the communication circuits $50_j$. In addition, the IC 10 comprises a second clock input terminal $55_2$ configured to receive a reference clock signal from outside the integrated circuit 10. In FIG. 3, the second clock input terminal $55_2$ is connected to the wire $8_2$. Moreover the IC 10 comprises a second clock-distribution network $60_2$ connected between the second clock input terminal $55_2$ and a second subset $65_2$ of the communication circuits $50_j$. As further described below, this structure of the reference clock distribution of the IC 10, with more than one reference clock input terminal and associated clock distribution network, facilitates a relatively low impact of reference clock phase noise in some use scenarios.

As illustrated in FIG. 3, the IC 10 may also have additional clock input terminals, such as a third clock input terminal $55_3$ and a fourth clock input terminal $55_4$, configured to receive reference clock signals from outside the integrated circuit 10, and for each of said additional clock input terminals $55_3$, $55_4$, a clock-distribution network $60_3$, $60_4$ connected between that clock input terminal $55_3$, $55_4$ and an associated subset, such as a third subset $65_3$ and a fourth subset $65_4$, of the communication circuits $50_j$.

As illustrated in FIG. 2 each of said clock-distribution networks $60_1$, $60_2$, $60_3$, $60_4$ may comprise buffer amplifiers 70, $80_k$ connected in a tree structure. Each of the plurality of communication circuits $50_j$ may have a reference-clock input connected to an output of a buffer amplifier $80_k$ of one of the clock-distribution networks $60_1$, $60_2$, $60_3$, $60_4$. It should be noted that the different communication circuits $50_j$ within a subset, say $65_m$, exhibits a slightly different phase noise in the reference clock signals, since they are provided by different buffers $80_k$. However, the phase noise already present in the reference clock signal received on clock input terminal $55_m$ propagates to all communication circuits $50_j$ in the subset $65_m$. Thus, there is a degree of correlation in the phase noise between the reference clock signals used by the communication circuits $50_j$ within the same subset $65_m$.

Figure 4:
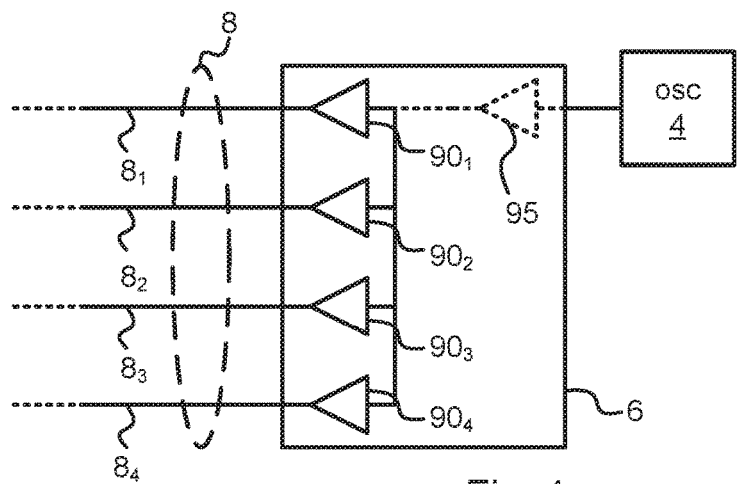

FIG. 4 illustrates a block diagram of an embodiment of the clock buffer circuit 6. As illustrated in FIG. 4, the clock buffer circuit 6 may have a plurality of output buffers $90_m$, each configured to output a buffered reference clock signal with the same frequency as the main reference clock signal at an output terminal of the output buffer $90_m$. In the example illustrated in FIG. 4, the output buffer $90_1$ is configured to output its buffered reference clock signal to the wire $8_1$, the output buffer $90_2$ is configured to output its buffered reference clock signal to the wire $8_2$, the output buffer $90_3$ is configured to output its buffered reference clock signal to the wire $8_3$, and the output buffer $90_4$ is configured to output its buffered reference clock signal to the wire 84. The clock buffer circuit 6 may also comprise one or more buffers 95 connected between the reference clock signal generator 4 and the output buffers $90_m$.

By using more than one clock input terminal for receiving reference clock signals, as in embodiments herein, it is possible to reduce the impact of phase noise. Consider, for comparison, an IC with only one single clock input terminal for receiving a single reference clock signal from outside the IC. e.g. from one single output buffer, such as the buffers $90_m$, of a clock buffer circuit, such as the clock buffer circuit 6. In such an IC, the LO signals in all communication circuits $50_j$ have to, ultimately, be derived from that single reference clock signal. Thus, even though there may be a clock-buffer tree between the single clock input terminal and the individual communication circuits $50_j$, the phase noise of said single reference clock signal is affecting all LO signals derived therefrom in the same way, resulting in a relatively high degree of phase-noise correlation between the generated LO signals. In case different ICs of the base station use different reference clock signals, with relatively little mutual correlation in the phase noise, the effects of the phase noise may be suppressed by averaging when all ICs are enabled. However, when only a subset of the ICs, in the extreme case only a single IC, is enabled to save energy, the effects of the relatively highly correlated phase noise in the LO signals within a single chip may have a detrimental impact on the overall signal quality. e.g. in terms of signal-to-noise ratio (SNR). If instead, as in embodiments disclosed herein, each IC 10 is equipped with more than one clock input terminal for receiving reference clock signals from the outside, the phase-noise correlation between LO signals within the same IC 10 can be reduced. Some degree of correlation between the reference clock signal on wire $8_1$ and the reference clock signal on wire $8_2$ should be expected, since they are derived from the same main reference clock signal. However, the phase noise generated by the output buffer $90_1$ is only affecting the communication circuits $50_j$ in the subset $65_1$, the phase noise generated by the output buffer $90_1$ is only affecting the communication circuits $50_j$ in the subset $65_1$, the phase noise generated by the output buffer $90_2$ is only affecting the communication circuits $50_j$ in the subset $65_2$, the phase noise generated by the output buffer $90_3$ is only affecting the communication circuits $50_j$ in the subset $65_3$, and the phase noise generated by the output buffer $90_4$ is only affecting the communication circuits $50_j$ in the subset $65_4$. Hence, overall, for each IC 10a-d, the average correlation of the LO signal phase noise between two communication circuits $50_j$ on the same IC 10a-d can be made lower when more than one reference clock input terminal is used, compared with an IC with only a single reference clock signal input terminal. This is further illustrated with examples in FIGS. 5-7 described below.

Figure 5:
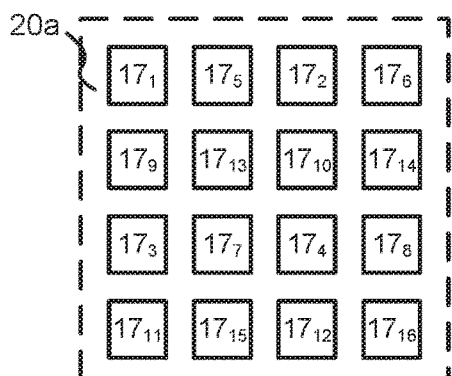
FIGS. 5-7 illustrate examples.
Figure 6:
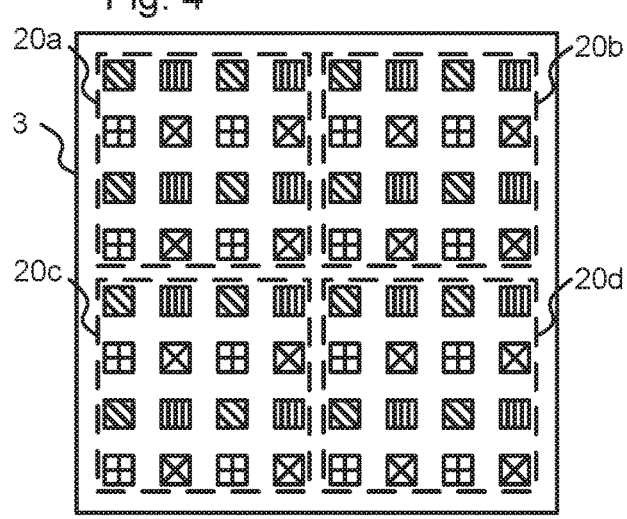
Figure 7:
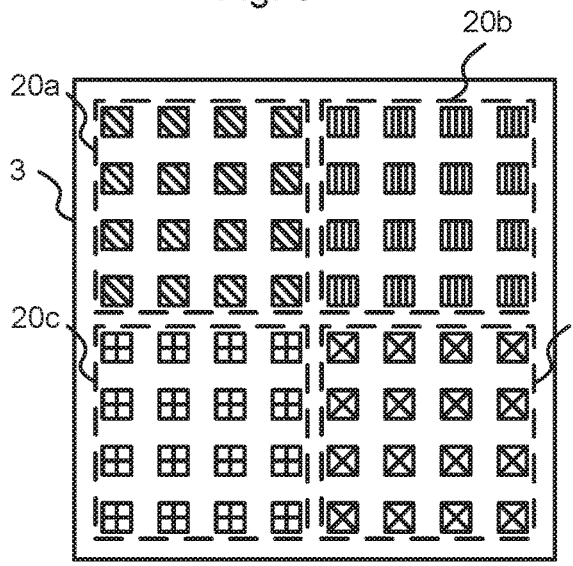

FIG. 5 illustrates the sub array 20a according to an embodiment. An index i is given to each antenna element $17_i$ of the sub array 20a. The antenna element $17_i$ is, in this embodiment, connected to the communication circuit $50_j$ (FIG. 3) of IC 10a. That is, antenna element 171 is connected to the communication circuit $50_1$, antenna element 172 is connected to the communication circuit $50_i$ etc. FIG. 6 illustrates the resulting reference clock distribution, provided that the antenna elements 17, of the other sub arrays 20b-d are connected to the communication circuits $50_j$ of the other ICs 10b-d according to the same pattern. The different fill patterns given to the different antenna elements illustrate which antenna elements are driven by what output buffer $90_m$ in the clock buffer circuit 6. It should be noted that each antenna element driven by a given output buffer $90_m$ is affected by the phase noise introduced by that output buffer $90_m$. As a comparison, FIG. 7 illustrates the corresponding situation in case each integrated circuit 10a-d had only had a single clock input terminal, with the clock input terminal of IC 10a connected to the output buffer $90_1$, the clock input terminal of IC 10b connected to the output buffer $90_2$, the clock input terminal of IC 10c connected to the output buffer $90_3$, and the clock input terminal of IC 10d connected to the output buffer $90_4$. Consider a situation where only the sub array 20a and IC 10a are enabled, whereas the other sub arrays 20b-d and ICs 10b-d are disabled for saving energy. In the comparative example illustrated in FIG. 7, all then enabled antenna elements are affected by the phase noise from the same output buffer $90_1$. The phase noise among the enabled antenna elements therefore shows a relatively high average mutual correlation. Hence, the resulting suppression of the effects of phase noise due to averaging over the multiple enabled antenna elements is relatively poor. In the embodiment illustrated in FIG. 6, on the other hand, the average mutual correlation of the phase noise among the enabled antenna elements is considerably lower, since only a fraction (in this case one fourth) of the enabled antenna elements are driven by the same output buffer $90_m$ of the clock buffer circuit 6. Therefore, the resulting suppression of the effects of phase noise due to averaging over the multiple enabled antenna elements is considerably better than for the comparative example illustrated in FIG. 7. Similar effects are obtained, but not to the same degree, when two or three of the sub arrays are enabled. When all four sub arrays 20a-d are enabled, the embodiment in FIG. 6 and the comparative example illustrated in FIG. 7 have about the same suppression of the phase noise due to averaging over the multiple antenna elements. However, the impact of the correlation of phase noise between antenna elements may be expected to be larger for adjacent antenna elements than for antenna elements that are a farther distance apart. As a consequence, the embodiment in FIG. 6 may actually provide some degree of improved suppression of the phase noise compared with the comparative example illustrated in FIG. 7 even when all four sub arrays are enabled.

In the examples presented above, the number of output buffers $90_m$ and clock wires $8_m$ are the same as the number of clock input terminals $55_m$. Each output buffer $90_m$ of the clock buffer circuit 6 has its output terminal connected to exactly one of the clock input terminals $55_m$ of each one of the ICs 10a-d. In other embodiments, the number of output buffers $90_m$ of the clock buffer circuit 6 may be higher than the number of clock input terminals $55_m$. Then, for a given one of the ICs 10a-d, an output buffer $90_m$ may have its output terminal to one or none of the clock input terminals 50m of the given ICs 10a-d. A formulation that covers both the scenario wherein the number of output buffers $90_m$ is equal to the number of clock input terminals $55_m$ of each one of the ICs 10a-d and the scenario wherein the number of output buffers $90_m$ is higher than the number of clock input terminals $55_m$ of each one of the ICs 10a-d is that each output buffer $90_m$ of the clock buffer circuit 6 has its output terminal connected to at most one of the clock input terminals $55_m$ of the same one of the integrated circuits 10a-d.

The present invention is presented above with reference to specific embodiments. However, other embodiments than the above described are possible within the scope of the disclosure. The different features of the embodiments may be combined in other combinations than those described. For example, 5G communications systems are used as an example environment in the disclosure above. However, embodiments of the present invention are applicable in other scenarios and environments as well. Furthermore, a base station 2 having an antenna array with 64 antenna elements 17 and four ICs 10a-d each having four clock input terminals 55$_m$ was used as an example above. These numbers of antenna elements, ICs, and clock input terminals are mere examples, and other numbers may well be used in other embodiments.

What is claimed is:

1. A communication apparatus comprising
a reference clock signal generator configured to generate a main reference clock signal;
a clock buffer circuit configured to receive the main reference clock signal at an input terminal and having a plurality of output terminals, each configured to output a reference clock signal with the same frequency as the main reference clock signal;
a plurality of integrated circuits, wherein each integrated circuit is configured to be connected to an antenna module having multiple antenna elements, wherein each integrated circuit comprises:
a first clock input terminal configured to receive a reference clock signal from outside the integrated circuit; and
a second clock input terminal configured to receive a reference clock signal from outside the integrated circuit; and
wherein each output terminal of the clock buffer circuit is connected to at most one of the clock input terminals of the same one of the integrated circuits.

2. The communication apparatus of claim 1, wherein the output terminals are output terminals of respective output buffers, each output buffer configured to output a reference clock signal with the same frequency as the main reference clock signal at the output terminal of that output buffer.

3. The communication apparatus of claim 2, wherein each output buffer has its output terminal connected to at most one of the clock input terminals of the same one of the integrated circuits.

4. The communication apparatus of claim 1, wherein each integrated circuit further comprises a plurality of communication circuits, each of which is configured to be connected to an antenna element of the antenna module.

5. The communication apparatus of claim 1, wherein each integrated circuit further comprises:
a first clock-distribution network connected between the first clock input terminal and a first subset of the communication circuits; and
a second clock-distribution network connected between the second clock input terminal and a second subset of the communication circuits.

6. The communication apparatus of claim 1, comprising the antenna module having multiple antenna elements, each connected to a communication circuit of an integrated circuit among said plurality of integrated circuit.

7. The communication apparatus of claim 1, wherein the reference clock signal generator is a crystal oscillator.

8. The communication apparatus of claim 1, configured to selectively disable one or more of the plurality of integrated circuits.

9. The communication apparatus of claim 1, configured to operate with beamforming transmission or reception.

10. The communication apparatus of claim 1, wherein the communication apparatus is configured for operation in a cellular communications network.

11. The communication apparatus of claim 9, wherein the communication apparatus is a base station.

12. The communication apparatus of claim 10, wherein the communication apparatus is a base station.

* * * * *